(12) United States Patent
Pommer

(10) Patent No.: US 6,338,776 B1
(45) Date of Patent: *Jan. 15, 2002

(54) DIELECTRIC PROCESSING WITH INCLUDED STABILIZATION PERIODS

(75) Inventor: Richard J. Pommer, Trabuco Canyon, CA (US)

(73) Assignee: Honeywell International Inc., Morris Township, NJ (US)

(*) Notice: Subject to any disclaimer, the term of this patent is extended or adjusted under 35 U.S.C. 154(b) by 0 days.

This patent is subject to a terminal disclaimer.

(21) Appl. No.: 09/512,970

(22) Filed: Feb. 24, 2000

Related U.S. Application Data

(63) Continuation-in-part of application No. 09/369,037, filed on Aug. 4, 1999, now Pat. No. 6,153,060.

(51) Int. Cl.$^7$ ................ B23K 26/00; G03C 5/00; B23B 35/00; B05D 5/12; C23C 14/00

(52) U.S. Cl. ................ 204/192.12; 204/192.15; 204/192.32; 204/192.36; 204/192.14; 204/192.13; 204/192.17; 430/327; 430/269; 430/313; 216/41; 427/307; 427/322; 427/407.1; 427/96; 427/445; 427/145; 219/121.71; 219/121.6; 219/129; 408/1 R

(58) Field of Search ............ 204/192.12, 192.14, 204/192.17, 192.13, 192.32, 192.36, 192.15; 430/327, 269, 313; 216/41; 427/307, 322, 407.1, 96, 99, 58, 445, 145

(56) References Cited

U.S. PATENT DOCUMENTS

| 5,202,220 | A | * | 4/1993 | Park et al. ............... 430/276.1 |
| 5,525,369 | A | * | 6/1996 | Blackwell et al. .......... 427/171 |
| 5,741,405 | A | * | 4/1998 | Statnikov et al. ...... 204/192.14 |
| 5,840,161 | A | * | 11/1998 | Woodard et al. ....... 204/192.14 |
| 6,153,060 | A | * | 11/2000 | Pommer et al. ....... 204/192.12 |

* cited by examiner

Primary Examiner—Alan Diamond
(74) Attorney, Agent, or Firm—Curtis B. Brueske

(57) ABSTRACT

The present invention is directed to allowing a work piece to stabilize in regard to temperature and humidity/water content prior to precision operations so as to minimize any problems resulting from dimensional changes.

7 Claims, 1 Drawing Sheet

---

10
providing a work piece comprising a dielectric material

20
placing the work piece in a first controlled environment for a sufficient period of time for the work piece to come into substantial equilibrium with the environment;

30
performing a first processing step on the work piece;

40
placing the work piece in a second environment for a sufficient period of time for the work piece to come into substantial equilibrium with the environment, wherein the second environment is controlled to substantially duplicate the first controlled environment;

50
performing a second processing step on the work piece

10 providing a work piece comprising a dielectric material

20 placing the work piece in a first controlled environment for a sufficient period of time for the work piece to come into substantial equilibrium with the environment;

30 performing a first processing step on the work piece;

40 placing the work piece in a second environment for a sufficient period of time for the work piece to come into substantial equilibrium with the environment, wherein the second environment is controlled to substantially duplicate the first controlled environment;

50 performing a second processing step on the work piece

Fig. 1

DIELECTRIC PROCESSING WITH INCLUDED STABILIZATION PERIODS

This is a continuation-in-part of U.S. application Ser. No. 09/369,037, filed Aug. 4, 1999, now U.S. Pat. No. 6,153,060.

FIELD OF THE INVENTION

The field of the invention is integrated circuit substrate manufacturing and printed circuit board manufacturing.

BACKGROUND OF THE INVENTION

During the processing of dielectric materials used in substrates, it is often necessary to precisely position various components/features of the material. As an example, if one drills a through hole in a base layer and later etches traces onto the surfaces of the base layer which are to be connected via the through hole, the through hole/via and traces must be precisely positioned relative to each other.

Similarly, pads on one layer of a multi-layer device being fabricated will often need to line up/achieve registration with a pad or other component on a corresponding layer when the layers are laminated together. Proper registration requires precisely locating the positions of various components on each layer and the layers relative to each other.

Precise positioning of components is complicated by the fact that the dimensions of dielectric materials such as polyimide films change as temperature and humidity change. The dimensional changes make it difficult to achieve proper registration between layers and to properly position components relative to each other. The difficulty increases as the number of components on each layer increases and the size of such components decreases. Thus, there is a continuing need for new methods and apparatus which allow proper registration between layers despite the affect of temperature and humidity on the dimensions of the layers.

SUMMARY OF THE INVENTION

The present invention is directed to allowing a work piece to achieve equilibrium with a controlled environment, particularly in regard to temperature and humidity/water content, prior to precision operations so as to minimize any problems resulting from dimensional changes. The present invention is particularly applicable to the creation of multi-layer devices such as interconnects used in IC packaging and very dense printed circuit boards.

Various objects, features, aspects and advantages of the present invention will become more apparent from the following detailed description of preferred embodiments of the invention, along with the accompanying drawings in which like numerals represent like components.

BRIEF DESCRIPTION OF THE DRAWINGS

FIG. 1 is a view of a first method embodying the invention.

DETAILED DESCRIPTION

Allowing a work piece to stabilize within an environment controlled with respect to temperature, relative humidity, or other environmental factors for a sufficient time (possibly several hours) prior to precision operations such as lasing, photo imaging, solder mask imaging, multilayers, and lamination facilitates increased precision by minimizing environment related dimensional changes.

Referring to FIG. 1, a method comprises step 10, providing a work piece comprising a dielectric material; step 20, placing the work piece in a first controlled environment for a sufficient period of time for the work piece to come into substantial equilibrium with the environment; step 30, performing a first processing step on the work piece; step 40, placing the work piece in a second environment for a sufficient period of time for the work piece to come into substantial equilibrium with the environment, wherein the second environment is controlled to substantially duplicate the first controlled environment; and step 50, performing a second processing step on the work piece.

In step 10, the work piece comprising a dielectric material may simply be a sheet of polyimide film or other dielectric material, or may comprise a more complex structure such as multiple layers laminated together. It is contemplated that the methods disclosed herein are particularly well adapted to use with work pieces which are used as layers in a laminate such as in a multi-layer interconnect.

In step 20, placing the work piece in a first controlled environment may simply comprise storing the work piece within the room in which the first processing step is to be performed, or placing it within an enclosure specifically designed to provide a controlled environment. Whether specifically controlled or not, the temperature, humidity, and any other relevant conditions of the first controlled environment will either need to be known or measured so that a similar environment can be provided at a later point in the process.

Step 30, performing a first processing step on the work piece can comprise almost any processing step in which precise locations and/or dimensions are a factor. It is contemplated that the disclosed methods are particularly beneficial when the first processing step is the lasing/drilling of through holes.

Step 40 comprises placing the work piece in a second environment for a sufficient period of time for the work piece to come into substantial equilibrium with the environment, wherein the second environment is controlled to substantially duplicate the first controlled environment. It is important to note that the second environment is made to match the first environment as closely as possible in regard to environmental factors which affect the dimensions of the work piece, particularly temperature and humidity. It is also important to note that the work piece must be allowed to achieve substantial equilibrium with the environment prior to performing the next processing step, even if it takes several hours to do so. As used herein, substantial equilibrium does not require that that a perfect equilibrium be obtained, but simply that the work piece be placed in the environment for a period of time so that differences between the current dimensions and the dimensions during the first processing step fall within acceptable tolerances. Although the tolerances vary depending on a number of factors including the processing steps to be performed and properties of the work piece, it is contemplated that in various embodiments, a work piece will have obtained substantial equilibrium when the difference in its temperature after stabilization in the second environment from its temperature in the first environment falls within one or more of the following ranges: less than 5 degrees Fahrenheit; less then 2 degrees Fahrenheit, less than 1 degree Fahrenheit; less than 0.5 degrees Fahrenheit; less than 0.25 degrees Fahrenheit. Another method of determining substantial equilibrium may be to measure the change in distance between vias over time with substantial equilibrium being obtained when the rate of change in distance between any two vias is less than a pre-determined threshold value. Yet another method may be to measure the distance between any two vias or other reference points in the first environment, and to measure the same distance in the second environment, where substantial equilibrium in the second environment is achieved when the difference in distances measured in the second and first environment is less than a pre-determined threshold value.

Placing the work piece in a controlled environment may involve placing the work piece within a special enclosure or may simply involve allowing the work piece to remain within a large room in which multiple processing steps are performed but in which the environment is controlled. If a special enclosure is to be used, the same enclosure may or may not be used for all stabilization steps.

The length of time required for adequate stabilization will likely vary depending on the characteristics of the work piece and the types of processing performed between stabilization steps. However, it is contemplated that the time required will generally fall within one or more of the following ranges: 1 to 5 minutes; 1 minute to 1 hour; 1 minute to 6 hours; 1 minute to 24 hours; 1 day to 10 days; at least 3 hours; at least 6 hours; at lest 12 hours.

In step 50, performing a second processing step on the work piece, as with step 30, may comprise almost any processing step in which precise locations and/or dimensions are a factor. It is contemplated that imaging, solder masking, and lamination are processing steps for which prior stabilization will provide a particular benefit.

It is contemplated that stabilization be performed before every processing step between which dimensional changes resulting from environmental factors are to be minimized. Thus, for a process involving lasing, imaging, solder mask, and lamination, stabilization prior to lasing, imaging, solder mask, and lamination is preferred, although processes involving a different number of stabilization steps are also contemplated.

It is contemplated that in some embodiments of the disclosed methods the work piece will be placed in a third environment in between performing the first and second processing steps, the third environment substantially differing from the first environment. It is also contemplated that some embodiments of the disclosed methods will include the following steps: (a) providing a work piece comprising a dielectric material; (b) placing the work piece in a first controlled environment for a sufficient period of time for the work piece to come into substantial equilibrium with the environment; (c) drilling through holes in the work piece; (e) sputtering conductive layers onto the work piece; (f) placing the work piece in a second environment for a sufficient period of time for the work piece to come into substantial equilibrium with the environment, wherein the second environment is controlled to substantially duplicate the first controlled environment; (g) subjecting the work piece to an imaging process; (h) etching the work piece; (i) placing the work piece in a third environment for a sufficient period of time for the work piece to come into substantial equilibrium with the environment, wherein the third environment is controlled to substantially duplicate the first controlled environment; (j) solder masking the work piece; (k) placing the work piece in a fourth environment for a sufficient period of time for the work piece to come into substantial equilibrium with the environment, wherein the fourth environment is controlled to substantially duplicate the first controlled environment; and (l) laminating the work piece with at least one other work piece subjected to the same preceding steps.

Thus, specific embodiments and applications of methods for processing dielectric wherein the methods include materials through the use of stabilization periods have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed is:

1. A method of processing comprising:
   providing a work piece comprising a dielectric material;
   placing the work piece in a first controlled environment for a sufficient period of time for the work piece to come into substantial equilibrium with the environment;
   performing a first processing step on the work piece wherein the first processing step comprises lasing or drilling the work piece;
   placing the work piece in a second environment for a sufficient period of time for the work piece to come into substantial equilibrium with the environment, wherein the second environment is controlled to substantially duplicate the first controlled environment; and
   performing a second processing step on the work piece.

2. The method of claim 1 wherein the second processing step comprises one of imaging, solder masking, and lamination.

3. A method of processing comprising:
   providing a work piece comprising a dielectric material;
   placing the work piece in a first controlled environment for a sufficient period of time for the work piece to come into substantial equilibrium with the environment wherein the period of time is at least 3 hours;
   performing a first processing step on the work piece;
   placing the work piece in a second environment for a sufficient period of time for the work piece to come into substantial equilibrium with the environment, wherein the second environment is controlled to substantially duplicate the first controlled environment; and
   performing a second processing step on the work piece.

4. A method of processing comprising:
   providing a work piece comprising a dielectric material;
   placing the work piece in a first controlled environment for a sufficient period of time for the work piece to come into substantial equilibrium with the environment;
   performing a first processing step on the work piece;
   placing the work piece in a second environment for a sufficient period of time for the work piece to come into substantial equilibrium with the environment, wherein the second environment is controlled to substantially duplicate the first controlled environment; and
   performing a second processing step on the work piece, wherein the second processing step is of a different kind than the first processing step.

5. The method of claim 4 wherein the first and second environments are controlled in regard to temperature and humidity.

6. The method of claim 4 wherein the work piece is placed in a third environment in between performing the first and second processing steps, the third environment substantially differing from the first environment.

7. A method of processing comprising:

providing a work piece comprising a dielectric material;

placing the work piece in a first controlled environment for a sufficient period of time for the work piece to come into substantial equilibrium with the environment;

drilling through holes in the work piece;

sputtering conductive layers onto the work piece;

placing the work piece in a second environment for a sufficient period of time for the work piece to come into substantial equilibrium with the environment, wherein the second environment is controlled to substantially duplicate the first controlled environment;

subjecting the work piece to an imaging process;

etching the work piece;

placing the work piece in a third environment for a sufficient period of time for the work piece to come into substantial equilibrium with the environment, wherein the third environment is controlled to substantially duplicate the first controlled environment;

solder masking the work piece;

placing the work piece in a fourth environment for a sufficient period of time for the work piece to come into substantial equilibrium with the environment, wherein the fourth environment is controlled to substantially duplicate the first controlled environment; and laminating the work piece with at least one other work piece subjected to the same preceding steps.

* * * * *